United States Patent
Oh et al.

(10) Patent No.: US 9,460,793 B1
(45) Date of Patent: Oct. 4, 2016

(54) SEMICONDUCTOR MEMORY DEVICE

(71) Applicant: SK hynix Inc., Icheon-si Gyeonggi-do (KR)

(72) Inventors: Sung Lae Oh, Cheongju-si Chungcheongbuk-do (KR); Soo Nam Jung, Seoul (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/859,635

(22) Filed: Sep. 21, 2015

(30) Foreign Application Priority Data

Jun. 12, 2015 (KR) .................. 10-2015-0083357

(51) Int. Cl.
| | |
|---|---|
| G11C 16/04 | (2006.01) |
| G11C 16/08 | (2006.01) |
| G11C 16/16 | (2006.01) |
| G11C 16/10 | (2006.01) |
| G11C 16/26 | (2006.01) |
| G11C 11/56 | (2006.01) |

(52) U.S. Cl.
CPC ........... *G11C 16/08* (2013.01); *G11C 16/0483* (2013.01); *G11C 16/10* (2013.01); *G11C 16/16* (2013.01); *G11C 16/26* (2013.01); *G11C 11/5628* (2013.01)

(58) Field of Classification Search
CPC ....... G11C 16/08; G11C 16/10; G11C 16/16; G11C 16/26; G11C 16/0483; G11C 11/5628
USPC .................... 365/185.12, 189.06, 230.08
See application file for complete search history.

(56) References Cited

U.S. PATENT DOCUMENTS

| | | | | |
|---|---|---|---|---|
| 6,469,955 B1* | 10/2002 | Tsao | ...................... | G11C 7/1042 365/185.17 |
| 7,298,648 B2* | 11/2007 | Lee | ...................... | G11C 11/5628 365/185.03 |
| 7,457,157 B2* | 11/2008 | Kim | ...................... | G11C 11/5628 365/185.03 |
| 7,623,377 B2* | 11/2009 | Lee | ...................... | G11C 11/5628 365/185.03 |
| 9,047,953 B2* | 6/2015 | Chen | .................. | G11C 16/0483 |

FOREIGN PATENT DOCUMENTS

KR     1020140123135 A     10/2014

* cited by examiner

*Primary Examiner* — Pho M Luu
(74) *Attorney, Agent, or Firm* — William Park & Associates Ltd.

(57) ABSTRACT

A semiconductor memory device may include: a memory cell array having a plurality of memory cells, a plurality of word lines and a plurality of bit lines; a page buffer block including N number of sub page buffer blocks which are arranged in a bit line direction and each of which includes a plurality of page buffers arranged in a word line direction and a bit line direction; common internal data lines respectively corresponding to the sub page buffer blocks; and a page buffer decoder including page buffer selection units which are electrically coupled between the page buffers included in each sub page buffer block and a common internal data line corresponding to the sub page buffer block and which electrically couple the page buffers included in the sub page buffer block selectively to the common internal data line.

20 Claims, 13 Drawing Sheets

FIG.11

PBB0

| PBo0 | PBo2 | PBo4 | PBo6 |
|---|---|---|---|
| PBe0 | PBe2 | PBe4 | PBe6 |
| PBo1 | PBo3 | PBo5 | PBo7 |
| PBe1 | PBe3 | PBe5 | PBe7 |
| PBo8 | PBo10 | PBo12 | PBo14 |
| PBe8 | PBe10 | PBe12 | PBe14 |
| PBo9 | PBo11 | PBo13 | PBo15 |
| PBe9 | PBe11 | PBe13 | PBe15 |
| PBo16 | PBo18 | PBo20 | PBo22 |
| PBe16 | PBe18 | PBe20 | PBe22 |
| PBo17 | PBo19 | PBo21 | PBo23 |
| PBe17 | PBe19 | PBe21 | PBe23 |

Rows 1–4: SPBB0
Rows 5–8: SPBB1
Rows 9–12: SPBB2

BLD ↑
WLD →

SEMICONDUCTOR MEMORY DEVICE

CROSS-REFERENCE TO RELATED APPLICATION

The present application claims priority under 35 U.S.C. §119(a) to Korean Patent Application No. 10-2015-0083357 filed in the Korean Intellectual Property Office on Jun. 12, 2015, which is incorporated herein by reference in its entirety.

BACKGROUND

1. Technical Field

Various embodiments generally relate to a semiconductor memory device.

2. Related Art

A semiconductor memory device is a memory device which is realized using a semiconductor such as silicon (Si), germanium (Ge), gallium arsenide (GaAs) and indium phosphide (InP), and is generally classified as either a volatile memory device or a nonvolatile memory device.

A volatile memory device is a memory device in which stored data is removed when a power supply is interrupted. A volatile memory device includes an SRAM (static random access memory), a DRAM (dynamic RAM), and an SDRAM (synchronous DRAM). A nonvolatile memory device is a memory device which retains data stored therein even when the power supply is interrupted. A nonvolatile memory device includes a ROM (read only memory), a PROM (programmable ROM), an EPROM (electrically programmable ROM), an EEPROM (electrically erasable and programmable ROM), a FLASH memory, a PRAM (phase change RAM), an MRAM (magnetic RAM), an RRAM (resistive RAM), and an FRAM (ferroelectric RAM).

SUMMARY

In an embodiment, a semiconductor memory device is provided. The semiconductor memory device may include a memory cell array having a plurality of memory cells, a plurality of word lines and a plurality of bit lines. The semiconductor memory device may include a page buffer block including N number of sub page buffer blocks which are arranged in a bit line direction and each of which includes a plurality of page buffers arranged in a word line direction and a bit line direction. The semiconductor memory device may include common internal data lines respectively corresponding to the sub page buffer blocks. The semiconductor memory device may include a page buffer decoder including page buffer selection units which are electrically coupled between the page buffers included in each sub page buffer block and the common internal data line corresponding to the sub page buffer block and which electrically couple the page buffers included in the sub page buffer block selectively to the common internal data line in response to bit line address signals.

In an embodiment, a semiconductor memory device is provided. The semiconductor memory device may include a memory cell array having a plurality of memory cells, a plurality of word lines and a plurality of odd and even bit lines. The semiconductor memory device may include a page buffer block including N number of sub page buffer blocks which are arranged in a bit line direction and each of which includes a plurality of even and odd page buffers arranged in a word line direction and a bit line direction. The semiconductor memory device may include common internal data lines respectively corresponding to the sub page buffer blocks. The semiconductor memory device may include a page buffer decoder including page buffer selection units which are electrically coupled between the even and odd page buffers included in each sub page buffer block and the common internal data line corresponding to the sub page buffer block and which electrically couple the even and odd page buffers included in the sub page buffer block selectively to the common internal data line in response to bit line address signals.

The semiconductor memory device may include a page buffer unit including a plurality of page buffer blocks arranged in a word line direction.

In an embodiment, a memory system is provided. The memory system may include a semiconductor memory device, and a controller configured to control write, read and erase operations of the semiconductor memory device in response to a request from a host. The semiconductor memory device may include a memory cell array having a plurality of memory cells, a plurality of word lines and a plurality of bit lines. The semiconductor memory device may include a page buffer block including N number of sub page buffer blocks which are arranged in a bit line direction and each of which includes a plurality of page buffers arranged in a 4 (word line direction)×2 (bit line direction) array. The semiconductor memory device may include common internal data lines respectively corresponding to the sub page buffer blocks. The semiconductor memory device may include a page buffer decoder including page buffer selection units which are electrically coupled between the page buffers included in each sub page buffer block and the common internal data line corresponding to the sub page buffer block and which electrically couple the page buffers included in the sub page buffer block selectively to the common internal data line in response to bit line address signals.

BRIEF DESCRIPTION OF THE DRAWINGS

FIG. 11 is a diagram illustrating a representation of an example of the layout structure of the page buffers included in a first page buffer block PBB0 of FIG. 7.

DETAILED DESCRIPTION

Hereinafter, semiconductor memory devices will be described below with reference to the accompanying drawings through various examples of embodiments.

Figure 1:
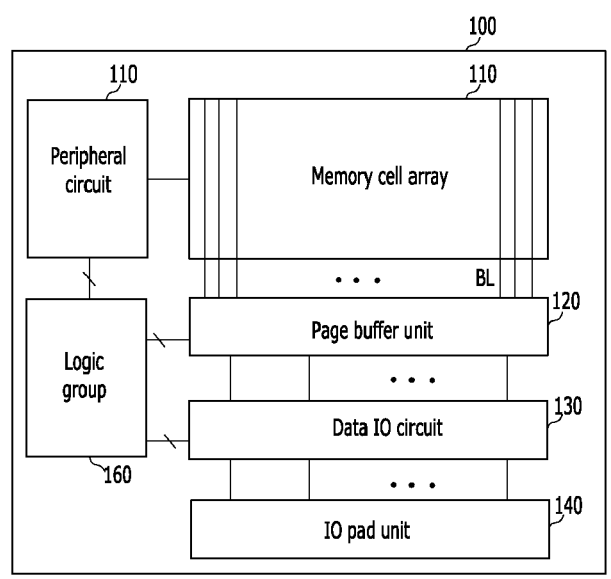
FIG. 1 is a diagram illustrating a representation of an example of a semiconductor memory device in accordance with an embodiment.

FIG. 1 is a diagram illustrating a representation of an example of a semiconductor memory device in accordance with an embodiment.

Referring to FIG. 1, a semiconductor memory device 100 may include a memory cell array 110, a page buffer unit 120, a data input/output (IC)) circuit 130, an IO pad unit 140, a peripheral circuit 150, and a logic group 160.

The memory cell array 110 may include memory cells capable of storing data. The memory cells are electrically coupled with word lines (not illustrated) and bit lines BL. A memory cell may be selected by selecting a word line and a bit line BL.

The page buffer unit 120 may include a plurality of page buffers. Each page buffer is electrically coupled to at least one bit line BL, and temporarily stores data to be stored in a selected memory cell or reads out and stores the data stored in a selected memory cell.

The data input/output circuit 130 operates between the page buffer unit 120 and the IO pad unit 140 to input/output data. The data input/output circuit 130 may include a sensing circuit (not illustrated) for sensing the data outputted from the page buffer unit 120 and transferring the sensed data to the IO pad unit 140.

The IO pad unit 140 may include pads which are electrically coupled to an exterior of the semiconductor memory device 100.

The peripheral circuit 150 may include circuits for operating together with the page buffer unit 120 when reading out data from a memory cell or storing data in a memory cell.

The logic group 160 outputs control signals for controlling operations of the page buffer unit 120, the data input/output circuit 130, the IO pad unit 140 and the peripheral circuit 150.

The electrical coupling relationship between the memory cell array 110 and the page buffer unit 120 will be described below.

Figure 2:
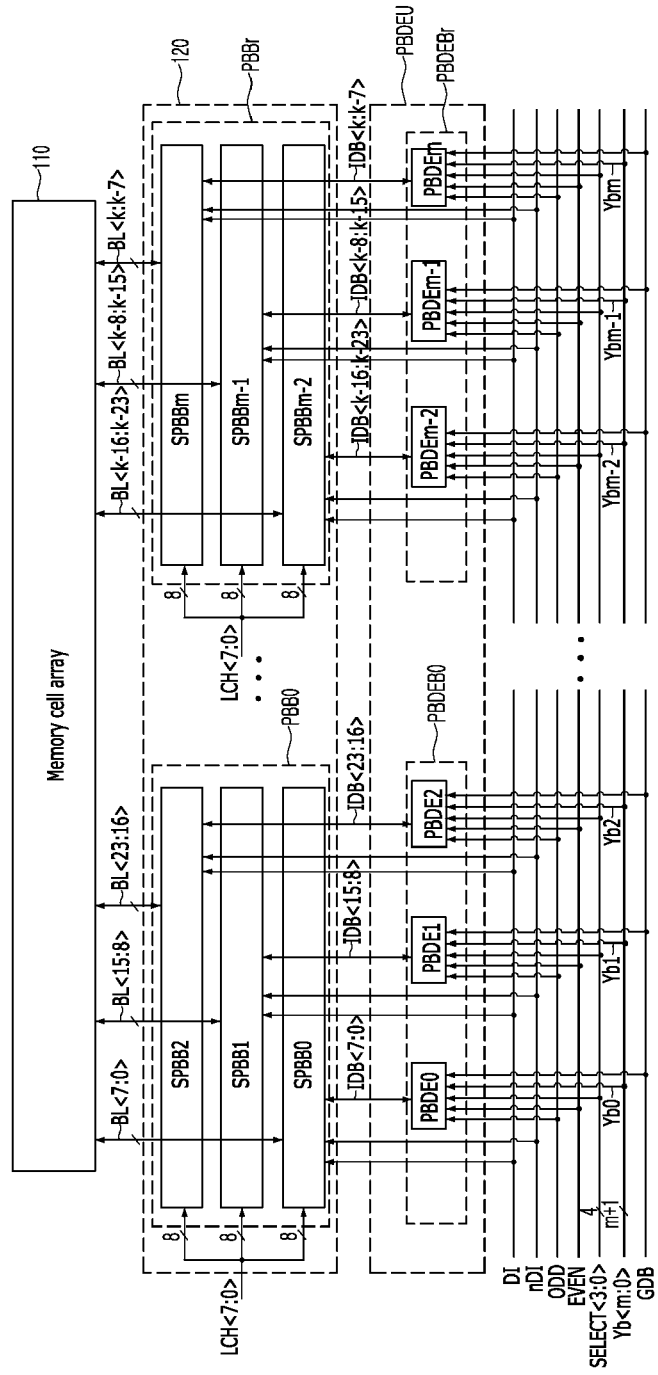
FIG. 2 is a representation of an example of a diagram to assist in the explanation of the electrical coupling relationship of the page buffer unit and the memory cell array illustrated in FIG. 1.

FIG. 2 is a representation of an example of a diagram to assist in the explanation of the electrical coupling relationship of the page buffer unit 120 and the memory cell array 110 illustrated in FIG. 1.

Referring to FIG. 2, the semiconductor memory device in accordance with an embodiment may use a Y-gating technology to access the bit lines of a memory. As illustrated in the drawing, the page buffer unit 120 is electrically coupled to the memory cell array 110 through bit lines BL<k:0>. In an embodiment K may be an integer greater than zero.

The page buffer unit 120 may include a plurality of page buffer blocks PBB<r:0> which are arranged in the direction of word lines which are perpendicular to the bit lines BL<k:0>. In an embodiment, r relating to page buffer bocks PBB<r:0> may be an integer greater than zero.

Each of the page buffer blocks PBB<r:0> may include N (N is 2 or 3) number of sub page buffer blocks. In an embodiment, N may be an integer greater than zero. The present embodiment illustrates the example where the number of the sub page buffer blocks included in each of the page buffer blocks PBB<r:0> is 3. Sub page buffer blocks SPBB included in each of the page buffer blocks PBB<r:0> are arranged in a bit line direction.

Each of sub page buffer blocks SPBB<m:0> interfaces with 8 bit lines. In an embodiment, m may be an integer greater than zero. While not illustrated in FIG. 2, each of the bit lines BL<k:0> actually may include a pair of odd and even bit lines, and these configurations will be described later with reference to FIG. 3.

A page buffer decoder unit PBDEU may include a plurality of page buffer decoder blocks PBDEB<r:0> respectively corresponding to the page buffer blocks PBB<r:0>. In an embodiment, r relating to page buffer bocks PBDEB<r:0> may be an integer greater than zero. In FIG. 1 described above, it is to be understood for the sake of convenience and simplification in explanation that the page buffer decoder unit PBDEU is included in the page buffer unit 120. However, it is to be noted that the page buffer decoder unit PBDEU may not be included in the page buffer unit 120 and may be configured separately from the page buffer unit 120.

Each of the page buffer decoder blocks PBDEB<r:0> may include a plurality of page buffer decoders PBDE which respectively correspond to the sub page buffer blocks SPBB included in a corresponding page buffer block PBB. Accordingly, the number of the page buffer decoders PBDE included in each of the page buffer decoder blocks PBDEB<r:0> may be substantially the same as the number of the sub page buffer blocks SPBB included in a corresponding page buffer block PBB. In an embodiment, each of the page buffer decoder blocks PBDEB<r:0> may include 3 page buffer decoders PBDE. However, the embodiments are not limited in this manner.

The page buffer decoders PBDE included in each of the page buffer decoder blocks PBDEB<r:0> are effectively electrically coupled to corresponding sub page buffer blocks SPBB, lines of bit line address signals ODD, EVEN, SELECT<3:0> and lines of global bit line address signals Yb<m:0> and a global data bus GDB. In an embodiment, m, with regards to global bit line address signal Yb<m:0>, may be an integer greater than zero.

As will be described below, the bit line address signals ODD, EVEN and SELECT<3:0> are applied in common to all page buffer decoders PBDE<m:0>. In an embodiment, m, with regards to page buffer decoders PBDE<m:0>, may be an integer greater than zero. The global bit line address signals Yb<m:0> are respectively applied to corresponding page buffer decoders PBDE<m:0>. For example, the page buffer decoder PBDE0 receives the bit line address signals ODD, EVEN, SELECT<3:0> and a global bit line address signal Yb0, the page buffer decoder PBDE1 receives the bit line address signals ODD, EVEN, SELECT<3:0> and a global bit line address signal Yb1, and the page buffer decoder PBDE2 receives the bit line address signals ODD, EVEN, SELECT<3:0> and a global bit line address signal Yb2.

Internal data lines IDB<k:0> are electrically coupled between the sub page buffer blocks SPBB<m:0> and the page buffer decoders PBDE<m:0>. In an embodiment, k, with regards to internal data lines IDB<k:0>, may be an integer greater than zero. In the example illustrated in FIG. 2, 8 internal data lines IDB are provided between a pair of a corresponding sub page buffer block SPBB and a corresponding page buffer decoder PBDE. However, the embodiments are not limited in this manner.

Data input select signals DI and nDI and latch signals LCH<7:0> are applied to the sub page buffer blocks SPBB<m:0>, and the functions thereof will be described later with reference to FIG. 4. In an embodiment, n, with regards to nDI, may be an integer greater than zero.

Figure 3:
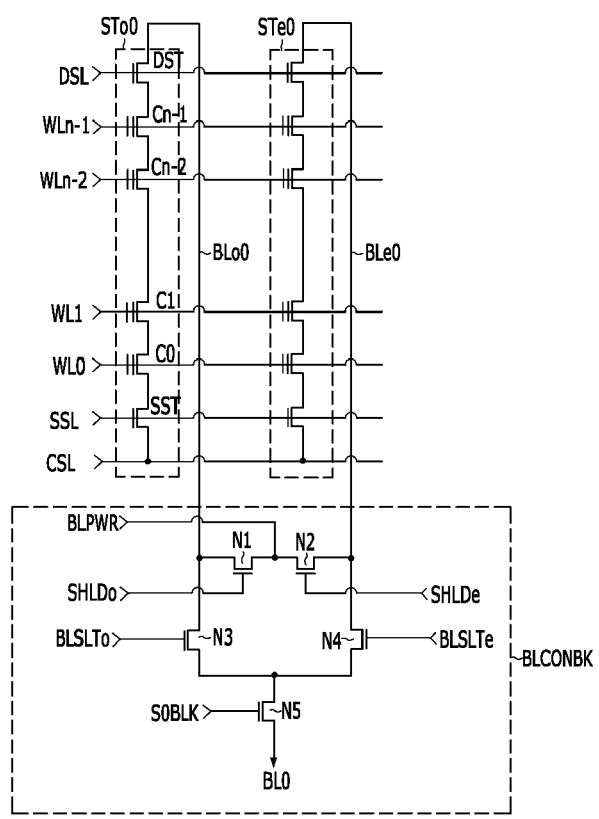
FIG. 3 is a circuit diagram illustrating a representation of an example of the cell strings electrically coupled to a first bit line BL0 in FIG. 2.

FIG. 3 is a diagram illustrating a representation of an example of a portion of the memory cell array illustrated in FIG. 2.

In particular, FIG. 3 is illustrated with a circuit associated with first odd and even cell strings STo0 and Ste0 which are electrically coupled with the first bit line BL0 of FIG. 2. Circuits associated with cell strings which are electrically coupled with the remaining bit lines BL<k:1> are realized similarly to the circuit associated with the first odd and even cell strings STo0 and STe0 illustrated in FIG. 3.

Referring to FIGS. 2 and 3, the memory cell array 110 may include a matrix array of memory cells (not illustrated), a plurality of word lines WL<n−1:0>, and a plurality of bit lines BL<k:0>. In an embodiment, n, related to the word lines WL<n−1:0>, may be an integer greater than zero. In the present embodiment, memory cells are flash memory cells, and the memory cell array 110 is a NAND type flash memory cell array. However, the embodiments are not limited in this manner.

Referring to FIG. 3, each of the first odd and even cell strings STo0 and STe0 may include a drain select transistor DST, a source select transistor SST, and a plurality of memory cells C<n−1:0> (where n may be an integer greater than zero) which are electrically coupled in series between the drain select transistor DST and the source select transistor SST. The word lines WL<n−1:0> are electrically coupled to the gates of the respective memory cells C<n−1:0>, and a drain select line DSL is electrically coupled to the gate of the drain select transistor DST. A source select line SSL is electrically coupled to the gate of the source select transistor SST.

A first odd bit line BLo0 is electrically coupled to the drain terminal of the drain select transistor DST of the first odd cell string STo0, and a first even bit line BLe0 is electrically coupled to the drain terminal of the drain select transistor DST of the first even cell string STe0. The source terminals of the source select transistors SSL of the first odd and even cell strings STo0 and STe0 are electrically coupled in common to a common source line CSL.

The first odd and even bit lines BLo0 and BLe0 are electrically coupled to a bit line control block BLCONBK. In FIG. 2 described above, it is to be understood for the sake of convenience and simplification in explanation that the bit line control block BLCONBK is included in the memory cell array 110. However, it is to be noted that the bit line control block BLCONBK may not be included in the memory cell array 110 and may be configured separately from the memory cell array 110.

In each of read, program and erase operation modes, the bit line control block BLCONBK selects one of the first odd bit line BLo0 and the first even bit line BLe0, and electrically couples a selected bit line to the first bit line BL0. Such an operation is performed by a transistor N5 which is controlled by a sensing node blocking signal SOBLK and transistors N3 and N4 which are controlled by an odd bit line select signal BLSLTo and an even bit line select signal BLSLTe, respectively.

In addition, the bit line control block BLCONBK functions to precharge or control the voltages of the first odd bit line BLo0 and the first even bit line BLe0 in the read, program and erase operation modes. Transistors N1 and N2 are provided for this purpose. That is to say, the transistor N1 responds to an odd shield signal SHLDo for selectively electrically coupling a bit line power voltage BLPWR to the first odd bit line BLo0, and the transistor N2 responds to an even shield signal SHLDe for selectively electrically coupling the bit line power voltage BLPWR to the first even bit line BLe0.

Figure 4:
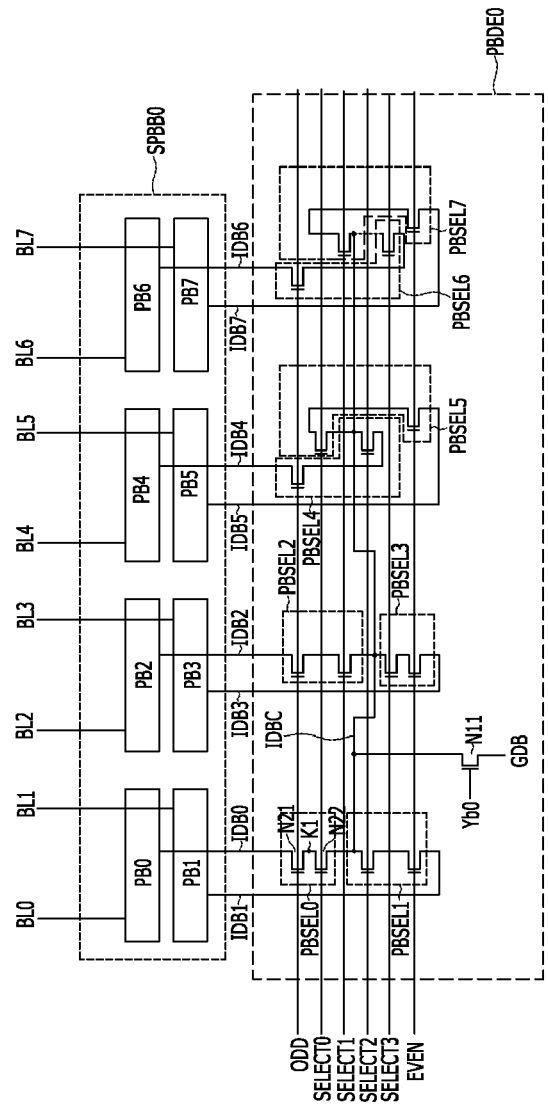
FIG. 4 is a representation of an example of a diagram to assist in the explanation of a sub page buffer block and a page buffer decoder illustrated in FIG. 2.

FIG. 4 is a representation of an example of a diagram to assist in the explanation of the circuit configurations of a sub page buffer block and a page buffer decoder illustrated in FIG. 2.

In particular, FIG. 4 illustrates the configurations of the first sub page buffer block SPBB0 and the first page buffer decoder PBDE0 corresponding thereto, illustrated in FIG. 2. The configurations of the remaining sub page buffer blocks SPBB<m:1> and the remaining page buffer decoders PBDE<m:1> are realized similarly to the configurations of the first sub page buffer block SPBB0 and the first page buffer decoder PBDE0 illustrated in FIG. 4.

Referring to FIG. 4, the first sub page buffer block SPBB0 may include 8 page buffers PB<7:0>. The page buffers PB<7:0> are electrically coupled to the bit lines BL<7:0>, respectively. In the present embodiment, the page buffers PB<7:0> of the first sub page buffer block SPBB0 are arranged in a 4 (word line direction)×2 (bit line direction) array. For example, the eight page buffers PB<7:0> may be arranged to create 4 columns of 2 rows (i.e., 4 columns, each column having 2 rows, and each row of a column including one page buffer) as illustrated in FIG. 4. However, the embodiments are not limited in this manner and the page buffers PB of the sub page buffer blocks SPBBr may be arranged differently with more or less page buffers PB.

The first page buffer decoder PBDE0 may include a transistor N11 which is electrically coupled between the global data bus GDB and a common internal data line IDBC, and page buffer selection units PBSEL<7:0> which are electrically coupled between the common internal data line IDBC and the internal data lines IDB<7:0> of the page buffers PB<7:0>, respectively.

As illustrated, the global bit line address signal Yb0 is inputted to the gate of the transistor N11, and the transistor N11 electrically couples the global data bus GDB and the common internal data line IDBC in response to the global bit line address signal Yb0.

The page buffer selection units PBSEL<7:0> are configured to selectively electrically couple the internal data lines IDB<7:0> of the page buffers PB<7:0> to the common internal data line IDBC.

It is to be noted that the common internal data line IDBC is electrically coupled in common to the internal data lines IDB<7:0> of the page buffers PB<7:0> through the page buffer selection units PBSEL<7:0> and serves as a shared input/output line.

The page buffer selection units PBSEL<7:0> have circuit configurations similar to one another. Therefore, the circuit configuration of the first page buffer selection unit PBSEL0 will be representatively described below.

The first page buffer selection unit PBSEL0 may include a first transistor N21 which is electrically coupled between the internal data line IDB0 of the first page buffer PB0 and a first node K1, and a second transistor N22 which is electrically coupled between the first node K1 and the common internal data line IDBC. The bit line address signals ODD and SELECT0 are respectively inputted to the gates of the first and second transistors N21 and N22.

The bit line address signals ODD, EVEN and SELECT<3:0> are signals for selecting one among the page buffers included in a single page buffer block, and combinations of the bit line address signals ODD, EVEN and SELECT<3:0> inputted to the respective page buffer selection units PBSEL<7:0> are different from one another.

Hereafter, for the sake of convenience in explanation, the bit line address signals ODD and EVEN will be defined as first bit line address signals, and the bit line address signals SELECT<3:0> will be defined as second bit line address signals.

The first bit line address signals ODD and EVEN include an odd bit line address signal ODD and an even bit line address signal EVEN, and the second bit line address signals SELECT<3:0> include first to fourth bit signals SELECT<3:0>.

In the illustrated embodiment, the odd bit line address signal ODD is inputted to the gates of the first transistors N21 of the page buffer selection units PBSEL0, PBSEL2, PBSEL4 and PBSEL6 corresponding to the page buffers PB0, PB2, PB4 and PB6 disposed in a first row, and the first to fourth bit signals SELECT<3:0> are respectively inputted to the gates of the second transistors N22 of the page buffer selection units PBSEL0, PBSEL2, PBSEL4 and PBSEL6 corresponding to the page buffers PB0, PB2, PB4 and PB6 disposed in the first row.

Further, the even bit line address signal EVEN is inputted to the gates of the first transistors N21 of the page buffer selection units PBSEL1, PBSEL3, PBSEL5 and PBSEL7 corresponding to the page buffers PB1, PB3, PB5 and PB7 disposed in a second row, and the first to fourth bit signals SELECT<3:0> are respectively inputted to the gates of the second transistors N22 of the page buffer selection units PBSEL1, PBSEL3, PBSEL5 and PBSEL7 corresponding to the page buffers PB1, PB3, PB5 and PB7 disposed in the second row. The odd bit line address signal ODD and the even bit line address signal EVEN selectively have the value of '1', and the first to fourth bit signals SELECT<3:0> selectively have the value of '1'.

Accordingly, the first transistors N21 of the page buffer selection units PBSEL0, PBSEL2, PBSEL4 and PBSEL6 are turned on or the first transistors N21 of the page buffer selection units PBSEL1, PBSEL3, PBSEL5 and PBSEL7 are turned on, in response to the odd bit line address signal ODD and the even bit line address signal EVEN. Any one among the second transistors N22 of the page buffer selection units PBSEL0, PBSEL2, PBSEL4 and PBSEL6 and any one among the second transistors N22 of the page buffer selection units PBSEL1, PBSEL3, PBSEL5 and PBSEL7 are turned on in response to the first to fourth bit signals SELECT<3:0>.

In other words, among the page buffer selection units PBSEL<7:0> in the first page buffer decoder PBDE0, there exists 1 page buffer selection units in which the first and second transistors N21 and N22 are simultaneously turned on by the combination of the bit line address signals ODD, EVEN and SELECT<3:0>. By the corresponding page buffer selection unit, the internal data line of a page buffer and the common internal data line IDBC are electrically coupled with each other.

Namely, by the combination of the bit line address signals ODD, EVEN and SELECT<3:0>, one page buffer is selected among the page buffers PB<7:0> in the sub page buffer block SPBB0 and exchanges data with the common internal data line IDBC.

Since the 8 page buffers PB<7:0> are selected using the 6-bit bit line address signals ODD, EVEN and SELECT<3:0>, the number of bit line address signal lines may be decreased when compared to the example where bit line address signals are separately used in correspondence to the 8 page buffers PB<7:0>, respectively (in this example, 8-bit bit line address signals are used).

Figure 5:
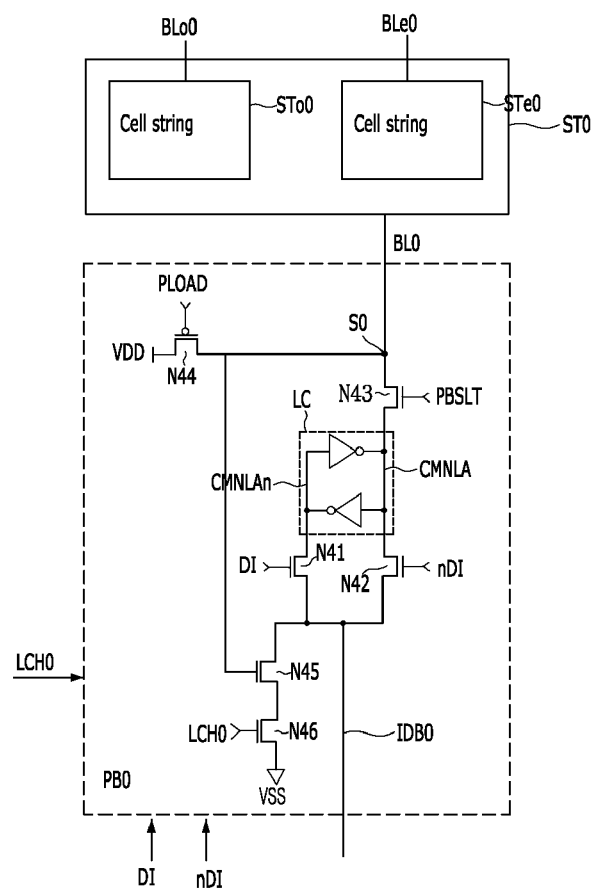
FIG. 5 is a representation of an example of a circuit diagram to assist in the explanation of a page buffer illustrated in FIG. 4.

FIG. 5 is a circuit diagram illustrating a representation of an example of a page buffer illustrated in FIG. 4.

In particular, FIG. 5 illustrates the circuit configuration of the first page buffer PB0. The circuit configurations of the remaining page buffers PB<7:1> are realized similarly to the circuit configuration of the first page buffer PB0 illustrated in FIG. 5.

Referring to FIG. 5, the first page buffer PB0 may include a latch circuit LC which has a latch node CMNLA and an inverted latch node CMNLAn. Transistors N41 and N42 of the first page buffer PB0 are respectively controlled by the data input select signals DI and nDI. The transistors N41 and N42 are electrically coupled between the first internal data line IDB0 and the inverted latch node CMNLAn and between the first internal data line IDB0 and the latch node CMNLA, respectively. Another transistor N43 is controlled by a page buffer select signal PBSLT, and is electrically coupled between the latch node CMNLA and a sense node S0. The sense node S0 electrically coupled to a first memory cell string ST0 is selectively electrically coupled to a power supply voltage VDD by the operation of another transistor N44 which is controlled by a load control signal PLOAD. Finally, 2 transistors N45 and N46 are electrically coupled in series between the first internal data line IDB0 and a reference voltage VSS. One of the 2 transistors N45 and N46 is controlled by a voltage appearing on the sense node S0, and the other of the 2 transistors N45 and N46 is controlled by the latch signal LCH0.

In a program operation, the latch circuit LC of the first page buffer PB0 stores a logic value that is indicated by the data input select signals DI and nDI and the voltage of the first internal data line IDB0. Then, the logic value, that is, a voltage appearing on the latch node CMNLA is transmitted to the first memory cell string ST0 through the first bit line BL0 for programming. In a manner similar to this, in a read operation, a sensed voltage appearing on the sense node S0 is temporarily stored in the latch circuit LC, and is then outputted to an exterior through the first internal data line IDB0.

The page buffer in accordance with the embodiment is not limited to the circuit configuration illustrated in FIG. 5, and may be changed in a variety of ways. For example, the page buffer may include at least 2 latch circuits and may include a cache buffer. Since the realization of such a page buffer may be easily derived by a person skilled in the art to which the embodiment pertains, further descriptions thereof will be omitted herein.

Figure 6:
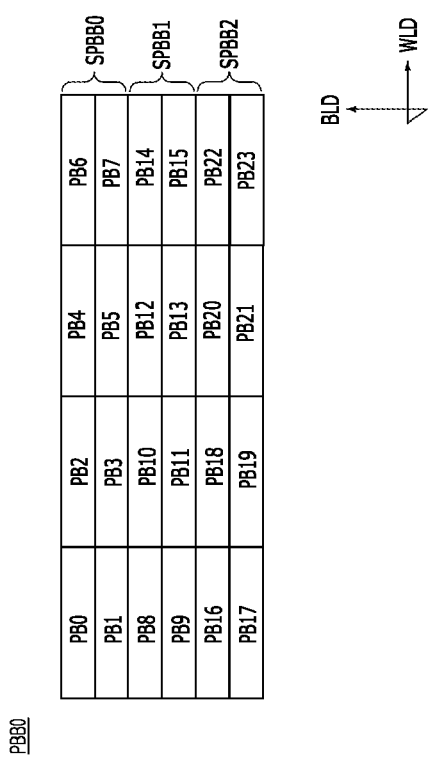
FIG. 6 is a diagram illustrating a representation of an example of the layout structure of the page buffers included in a first page buffer block PBB0 of FIG. 2.

FIG. 6 is a diagram illustrating a representation of an example of the layout structure of the page buffers included in a page buffer block illustrated in FIG. 2. In particular, FIG. 6 illustrates the first page buffer block PBB0.

Referring to FIG. 6, the first page buffer block PBB0 may include N (N is 2 or 3) number of sub page buffer blocks SPBB<2:0> which are arranged in a bit line direction BLD. The present embodiment illustrates the example where the number of the sub page buffer blocks SPBB included in the first page buffer block PBB0 is 3. However, the embodiments are not limited in this manner and any number of sub page buffer blocks may be implemented.

Each of the sub page buffer blocks SPBB<2:0> may include 8 page buffers PB which are arranged in a 4 (word line direction)×2 (bit line direction) array. That is to say, the first sub page buffer block SPBB0 may include first to eighth page buffers PB<7:0> which are arranged in a 4 (word line direction)×2 (bit line direction) array, the second sub page buffer block SPBB1 may include ninth to sixteenth page buffers PB<15:8> which are arranged in a 4 (word line direction)×2 (bit line direction) array, and the third sub page buffer block SPBB2 may include seventeenth to twenty-fourth page buffers PB<23:16> which are arranged in a 4 (word line direction)×2 (bit line direction) array. For example, the eight page buffers (i.e., PB<7:0>, PB<15:8>, or PB<23:16>) may be arranged to create 4 columns of 2 rows (i.e., 4 columns, each column having 2 rows, and each row of a column including one page buffer) as illustrated in FIG. 4. However, the embodiments are not limited in this manner and the page buffers PB of the sub page buffer blocks SPBBr may be arranged differently with more or less page buffers PB.

Since the 3 sub page buffer blocks SPBB<2:0> are arranged in the bit line direction BLD and page buffers PB in each of the sub page buffer blocks SPBB<2:0> are arranged in 2 rows in the bit line direction BLD, the page buffers PB of the first page buffer block PBB0 are arranged in 6 rows in the bit line direction BLD. Thus, the length of the first page buffer block PBB0 in the bit line direction BLD will be [the length of each page buffer in the bit line direction]×(times or multiplied by) 6.

As described above with reference to FIG. 2, since the page buffer blocks PBB<r:0> are arranged in a word line direction WLD, the length of the page buffer unit 120 in the bit line direction BLD will be the same as the length of the first page buffer block PBB0 in the bit line direction BLD. In other words, the length of the page buffer unit 120 in the bit line direction BLD will be [the length of each page buffer in the bit line direction]×(times or multiplied by) 6.

Since the number of bit lines is K+1 and a pair of even and odd bit lines correspond to each bit line, the length of the page buffer unit 120 in the word line direction WLD will be [the pitch of each bit line]×(K+1)×2. In an embodiment, K, with regards to the number of bit lines, may be an integer greater than zero.

It may be assumed that, unlike the present embodiment, 8 page buffers included in each sub page buffer block are arranged in the bit line direction BLD in the viewpoint of transmission of data. In this example, since 8 page buffers are arranged in the bit line direction BLD, the length of the page buffer unit 120 in the bit line direction BLD cannot help but be increased when compared to the present embodiment in which 6 page buffers are arranged in the bit line direction BLD.

Since the number of bit lines is constant as K+1 and a pair of even and odd bit lines correspond to each bit line, the length of the page buffer unit 120 in the word line direction WLD will be [the pitch of each bit line]×(K+1)×2 to be the same as in the present embodiment.

Namely, according to an embodiment, the length of the page buffer unit 120 in the bit line direction BLD may be decreased while constantly retaining the length of the page buffer unit 120 in the word line direction WLD, and as a result, the occupation area of the page buffer unit 120 may be reduced.

Figure 7:
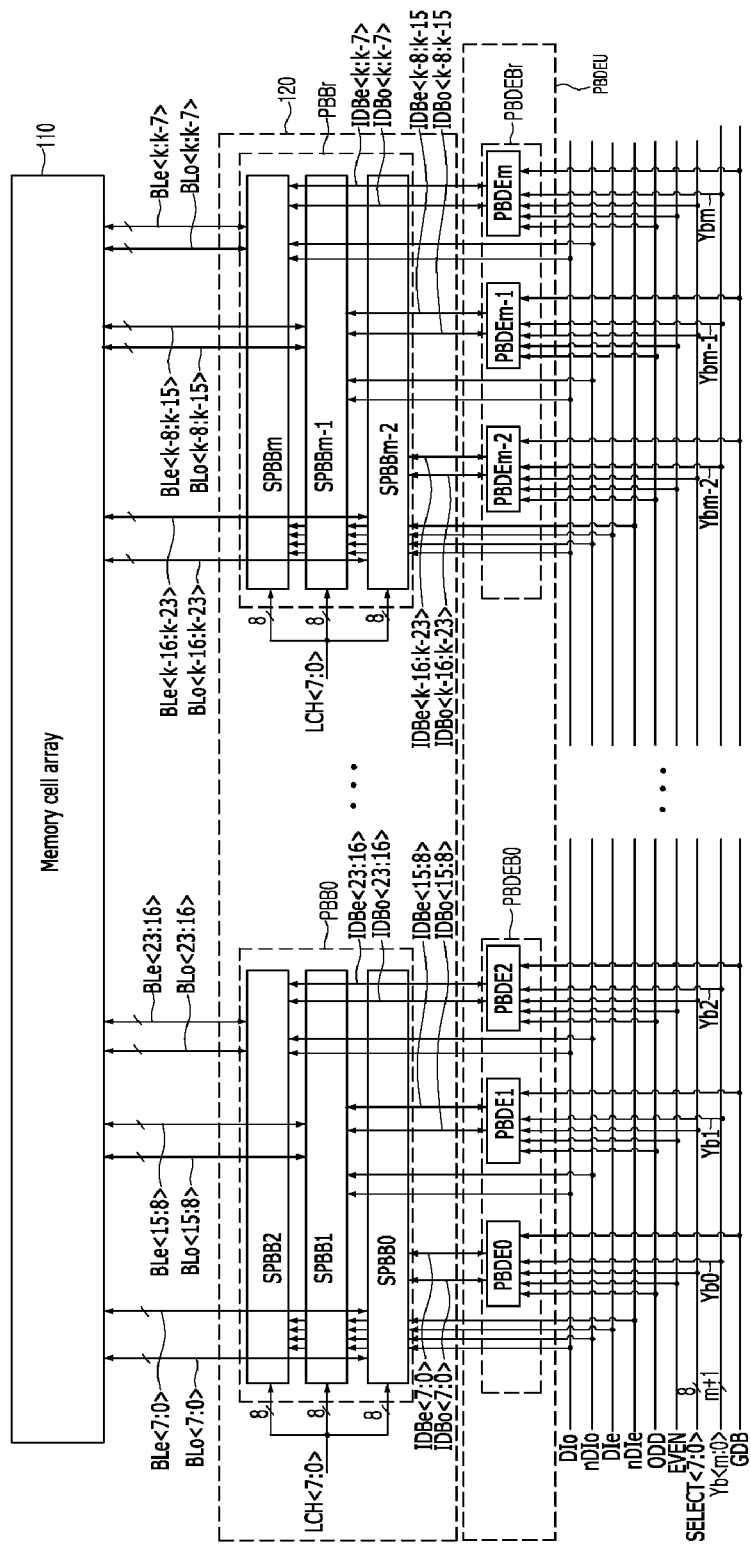
FIG. 7 is a representation of an example of a diagram to assist in the explanation of the electrical coupling relationship of the page buffer unit and the memory cell array illustrated in FIG. 1.

FIG. 7 is a representation of an example of a diagram to assist in the explanation of the electrical coupling relationship of the page buffer unit and the memory cell array illustrated in FIG. 1.

Referring to FIG. 7, the page buffer unit 120 is electrically coupled to the memory cell array 110 through odd bit lines BLo<k:0> and even bit lines BLe<k:0>.

The page buffer unit 120 may include a plurality of page buffer blocks PBB<r:0> which are arranged in the direction of word lines (not illustrated) which are perpendicular or substantially perpendicular to the bit lines BLo<k:0> and BLe<k:0>.

Each of the page buffer blocks PBB<r:0> may include N (N is 2 or 3) number of sub page buffer blocks. The present embodiment illustrates the example where the number of the sub page buffer blocks included in each of the page buffer blocks PBB<r:0> is 3.

Sub page buffer blocks SPBB included in each of the page buffer blocks PBB<r:0> are arranged in a bit line direction, and each of the sub page buffer blocks SPBB interfaces with 8 odd bit lines BLo and 8 even bit lines BLe.

A page buffer decoder unit PBDEU may include a plurality of page buffer decoder blocks PBDEB<r:0> respectively corresponding to the page buffer blocks PBB<r:0>.

Each of the page buffer decoder blocks PBDEB<r:0> may include a plurality of page buffer decoders PBDE which respectively correspond to the sub page buffer blocks SPBB included in a corresponding page buffer block PBB. Accordingly, the number of the page buffer decoders PBDE included in each of the page buffer decoder blocks PBDEB<r:0> may be substantially the same as the number of the sub page buffer blocks SPBB included in a corresponding page buffer block PBB. In an embodiment, each of the page buffer decoder blocks PBDEB<r:0> may include 3 page buffer decoders PBDE. However, the embodiments are not limited in this manner and there may be more or less page buffer decoder blocks PBDEB<r:0>.

The page buffer decoders PBDE included in each of the page buffer decoder blocks PBDEB<r:0> are effectively electrically coupled to corresponding sub page buffer blocks SPBB, lines of bit line address signals ODD, EVEN, SELECT<7:0> and global bit line address signals Yb<m:0> and a global data bus GDB.

As will be described below, the bit line address signals ODD, EVEN and SELECT<7:0> are applied in common to all page buffer decoders PBDE<m:0>. The global bit line address signals Yb<m:0> are respectively applied to corresponding page buffer decoders PBDE<m:0>. For example, the first page buffer decoder PBDE0 receives the bit line address signals ODD, EVEN, SELECT<7:0> and a global bit line address signal Yb0, the second page buffer decoder PBDE1 receives the bit line address signals ODD, EVEN, SELECT<7:0> and a global bit line address signal Yb1, and the third page buffer decoder PBDE2 receives the bit line address signals ODD, EVEN, SELECT<7:0> and a global bit line address signal Yb2.

Internal data lines IDBo<k:0> and IDBe<k:0> are electrically coupled between the sub page buffer blocks SPBB<m:0> and the page buffer decoders PBDE<m:0>. In the example illustrated in FIG. 7, 8 odd internal data lines IDBo and 8 even internal data lines IDBe are provided between a pair of a corresponding sub page buffer block SPBB and a corresponding page buffer decoder PBDE.

However, the embodiments are limited in this manner and more or less odd and even internal data lines may be provided.

Data input select signals DIo, nDIo, DIe and nDIe and latch signals LCH<7:0> are applied to the sub page buffer blocks SPBB<m:0>, and the functions thereof will be described later with reference to FIG. 10.

Figure 8:
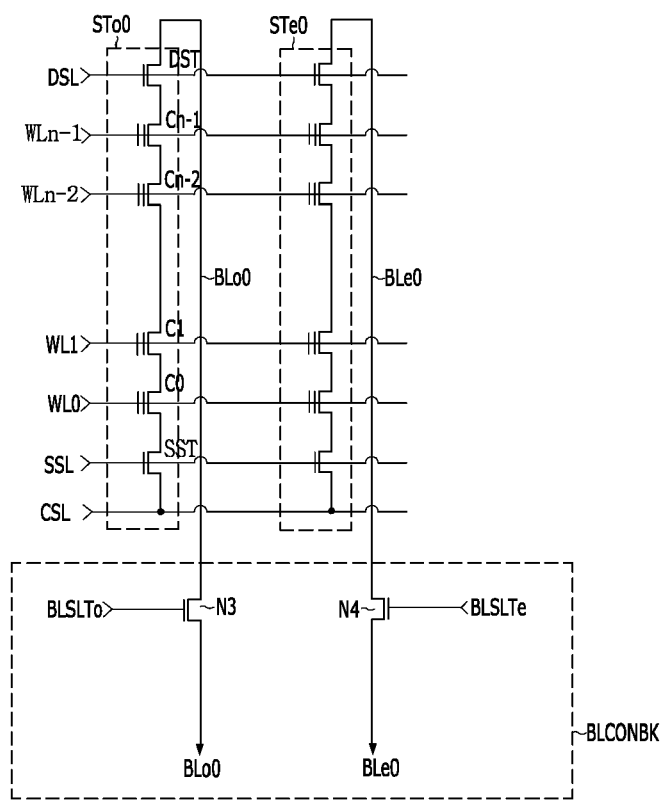
FIG. 8 is a circuit diagram illustrating a representation of an example of the cell strings electrically coupled to a first odd bit line BLo0 and a first even bit line BLe0 in FIG. 7.

FIG. 8 is a diagram illustrating a representation of an example of a portion of the memory cell array illustrated in FIG. 7.

In particular, FIG. 8 is a circuit diagram illustrating a representation of an example of first odd and even cell strings STo0 and STe0 electrically coupled to first odd and even bit lines BLo0 and BLe0 in FIG. 7.

Circuits associated with cell strings which are electrically coupled with remaining odd and even bit lines BLo<23:1> and BLe<23:1> are realized similarly to the circuit associated with the first odd and even cell strings STo0 and STe0 illustrated in FIG. 8.

Referring to FIGS. 7 and 8, the memory cell array 110 may include a matrix array of memory cells, a plurality of word lines WL<n−1:0>, and pluralities of bit lines BLo<k:0> and BLe<k:0>. The memory cells of the semiconductor memory device in accordance with an embodiment are flash memory cells, and the memory cell array 110 is a NAND type flash memory cell array. However, the embodiments are not limited in this manner and other types of memory cells may be implemented.

Referring to FIG. 8, each of the first odd and even cell strings STo0 and STe0 may include a drain select transistor DST, a source select transistor SST, and a plurality of memory cells C<n−1:0> which are electrically coupled in series between the drain select transistor DST and the source select transistor SST. The word lines WL<n−1:0> are electrically coupled to the gates of the respective memory cells C<n−1:0>, and a drain select line DSL is electrically coupled to the gate of the drain select transistor DST. A source select line SSL is electrically coupled to the gate of the source select transistor SST.

The first odd bit line BLo0 is electrically coupled to the drain terminal of the drain select transistor DST of the first odd cell string STo0, and the first even bit line BLe0 is electrically coupled to the drain terminal of the drain select transistor DST of the first even cell string STe0. The source terminals of the source select transistors SSL of the first odd and even cell strings STo0 and STe0 are electrically coupled in common to a common source line CSL.

The first odd and even bit lines BLo0 and BLe0 are electrically coupled to a bit line control block BLCONBK. In FIG. 7 described above, it is to be understood for the sake of convenience and simplification in explanation that the bit line control block BLCONBK is included in the memory cell array 110. However, it is to be noted that the bit line control block BLCONBK may not be included in the memory cell array 110 and may be configured separately from the memory cell array 110.

The bit line control block BLCONBK selects the first odd bit line BLo0 or the first even bit line BLe0. This operation is performed by transistors N3 and N4 which are controlled by an odd bit line select signal BLSLTo and an even bit line select signal BLSLTe, respectively.

Figure 9:
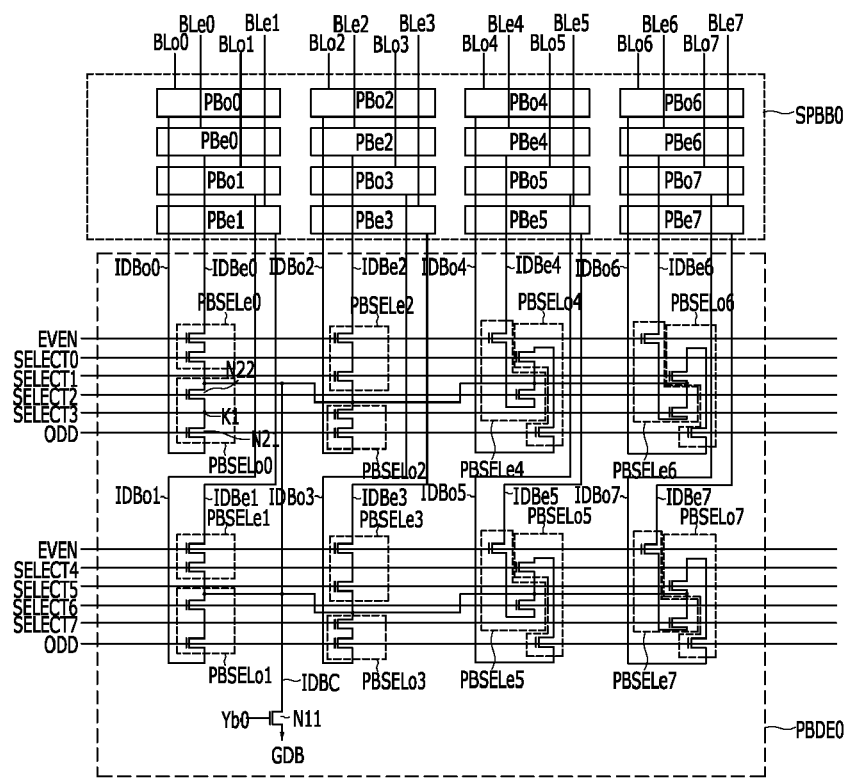
FIG. 9 is a representation of an example of a diagram to assist in the explanation of a sub page buffer block and a page buffer decoder illustrated in FIG. 7.

FIG. 9 is a representation of an example of a diagram to assist in the explanation of the circuit configurations of a sub page buffer block and a page buffer decoder illustrated in FIG. 7.

In particular, FIG. 9 illustrates the configurations of the first sub page buffer block SPBB0 and the first page buffer decoder PBDE0 corresponding thereto, illustrated in FIG. 7. The circuit configurations of the remaining sub page buffer blocks SPBB<m:1> and the remaining page buffer decoders PBDE<m:1> are realized similarly to the circuit configurations of the first sub page buffer block SPBB0 and the first page buffer decoder PBDE0 illustrated in FIG. 9.

Referring to FIG. 9, the first sub page buffer block SPBB0 may include 8 odd page buffers PBo<7:0> and 8 even page buffers PBe<7:0>. The odd page buffers PBo<7:0> are electrically coupled to the odd bit lines BLo<7:0>, respectively, and the even page buffers PBe<7:0> are electrically coupled to the even bit lines BLe<7:0>, respectively. In the present embodiment, the page buffers PBo<7:0> and PBe<7:0> of the first sub page buffer block SPBB0 are arranged in a 4 (word line direction)×4 (bit line direction) array. For example, the 16 page buffers (i.e., eight page buffers PBe<7:0> and eight page buffers PBo<7:0>) may be arranged to create 4 columns of 4 rows (i.e., 4 columns, each column having 4 rows, and each row of a column including one page buffer) as illustrated in FIG. 9. However, the embodiments are not limited in this manner and the page buffers PB of the sub page buffer blocks SPBBr may be arranged differently with more or less page buffers PB.

The first page buffer decoder PBDE0 may include a transistor N11 which is electrically coupled between the global data bus GDB and a common internal data line IDBC, and page buffer selection units PBSELo<7:0> and PBSELe<7:0> which are electrically coupled between the common internal data line IDBC and the internal data lines IDBo<7:0> and IDBe<7:0> of the page buffers PBo<7:0> and PBe<7:0>, respectively.

As illustrated, the global bit line address signal Yb0 is inputted to the gate of the transistor N11, and the transistor N11 electrically couples the global data bus GDB and the common internal data line IDBC in response to the global bit line address signal Yb0.

The page buffer selection units PBSELo<7:0> and PBSELe<7:0> function to selectively electrically couple the internal data lines IDBo<7:0> and IDBe<7:0> of the page buffers PBo<7:0> and PBe<7:0> to the common internal data line IDBC.

The common internal data line IDBC is electrically coupled in common to the internal data lines IDBo<7:0> and IDBe<7:0> of the page buffers PBo<7:0> and PBe<7:0> through the page buffer selection units PBSELo<7:0> and PBSELe<7:0> and serves as a shared input/output line.

The bit line address signals ODD, EVEN and SELECT<3:0> are inputted to the first, third, fifth and seventh odd page buffer selection units PBSELo0, PBSELo2, PBSELo4 and PBSELo6 and the first, third, fifth and seventh even page buffer selection units PBSELe0, PBSELe2, PBSELe4 and PBSELe6 corresponding to the odd page buffers PBo0, PBo2, PBo4 and PBo6 disposed in a first row and the even page buffers PBe0, PBe2, PBe4 and PBe6 disposed in a second row, and the bit line address signals ODD, EVEN and SELECT<7:4> are inputted to the second, fourth, sixth and eighth odd page buffer selection units PBSELo1, PBSELo3, PBSELo5 and PBSELo7 and the second, fourth, sixth and eighth even page buffer selection units PBSELe1, PBSELe3, PBSELe5 and PBSELe7 corresponding to the odd page buffers PBo1, PBo3, PBo5 and PBo7 disposed in a third row and the even page buffers PBe1, PBe3, PBe5 and PBe7 disposed in a fourth row.

Since the odd page buffer selection units PBSELo<7:0> and the even page buffer selection units PBSELe<7:0> have similar circuit configurations, the circuit configuration of the first odd page buffer selection unit PBSELo0 will be representatively described below.

The first odd page buffer selection unit PBSELo0 may include a first transistor N21 which is electrically coupled between the odd internal data line IDBo0 of the first odd page buffer PBo0 and a first node K1, and a second transistor N22 which is electrically coupled between the first node K1 and the common internal data line IDBC. The bit line address signals ODD and SELECT0 are respectively inputted to the gates of the first and second transistors N21 and N22.

The bit line address signals ODD, EVEN and SELECT<7:0> are address signals for selecting one among the page buffers included in a single page buffer block, and combinations of the bit line address signals ODD, EVEN and SELECT<7:0> inputted to the respective page buffer selection units PBSELo<7:0> and PBSELe<7:0> are different from one another.

Hereafter, for the sake of convenience in explanation, the bit line address signals ODD and EVEN will be defined as first bit line address signals, and the bit line address signals SELECT<7:0> will be defined as second bit line address signals.

The first bit line address signals ODD and EVEN include an odd bit line address signal ODD and an even bit line address signal EVEN, and the second bit line address signals SELECT<7:0> include first to eighth bit signals SELECT<7:0>.

In the illustrated embodiment, the odd bit line address signal ODD is inputted to the gates of the first transistors N21 of the page buffer selection units PBSELo<7:0> corresponding to the page buffers PBo<7:0> disposed in the first row and the third row, the first to fourth bit signals SELECT<3:0> are respectively inputted to the gates of the second transistors N22 of the page buffer selection units PBSELo0, PBSELo2, PBSELo4 and PBSELo6 corresponding to the page buffers PBo0, PBo2, PBo4 and PBo6 disposed in the first row, and the fifth to eighth bit signals SELECT<7:4> are respectively inputted to the gates of the second transistors N22 of the page buffer selection units PBSELo1, PBSELo3, PBSELo5 and PBSELo7 corresponding to the page buffers PBo1, PBo3, PBo5 and PBo7 disposed in the third row.

Further, the even bit line address signal EVEN is inputted to the gates of the first transistors N21 of the page buffer selection units PBSELe<7:0> corresponding to the page buffers PBe<7:0> disposed in the second row and the fourth row, the first to fourth bit signals SELECT<3:0> are respectively inputted to the gates of the second transistors N22 of the page buffer selection units PBSELe0, PBSELe2, PBSELe4 and PBSELe6 corresponding to the page buffers PBe0, PBe2, PBe4 and PBe6 disposed in the second row, and the fifth to eighth bit signals SELECT<7:4> are respectively inputted to the gates of the second transistors N22 of the page buffer selection units PBSELe1, PBSELe3, PBSELe5 and PBSELe7 corresponding to the page buffers PBe1, PBe3, PBe5 and PBe7 disposed in the fourth row.

The odd bit line address signal ODD and the even bit line address signal EVEN selectively have the value of '1', and the first to eighth bit signals SELECT<7:0> selectively have the value of '1'.

Accordingly, the first transistors N21 of the page buffer selection units PBSELo<7:0> corresponding to the page buffers PBo<7:0> disposed in the odd-numbered rows are turned on or the first transistors N21 of the page buffer selection units PBSELe<7:0> corresponding to the page buffers PBe<7:0> disposed in the even-numbered rows are turned on, in response to the odd bit line address signal ODD and the even bit line address signal EVEN. Any one among the second transistors N22 of the page buffer selection units PBSELo<7:0> corresponding to the page buffers PBo<7:0> disposed in the odd-numbered rows and any one among the second transistors N22 of the page buffer selection units PBSELe<7:0> corresponding to the page buffers PBe<7:0> disposed in the even-numbered rows are turned on in response to the first to eighth bit signals SELECT<7:0>.

In other words, there exists 1 page buffer selection unit in which the first and second transistors N21 and N22 are simultaneously turned on by the combination of the bit line address signals ODD, EVEN and SELECT<7:0>. By the corresponding page buffer selection unit, the internal data line IDB of a page buffer and the common internal data line IDBC are electrically coupled with each other.

Namely, by the combination of the bit line address signals ODD, EVEN and SELECT<7:0>, one page buffer is selected among the page buffers PBo<7:0> and PBe<7:0> in the first sub page buffer block SPBB0 and exchanges data with the common internal data line IDBC.

Since the 16 page buffers PBo<7:0> and PBe<7:0> are selected using the 10-bit bit line address signals ODD, EVEN and SELECT<7:0>, the number of bit line address signal lines may be decreased when compared to the example where bit line address signals respectively corresponding to the 16 page buffers PBo<7:0> and PBe<7:0> are configured (in this example, 16-bit bit line address signals are used).

Figure 10:
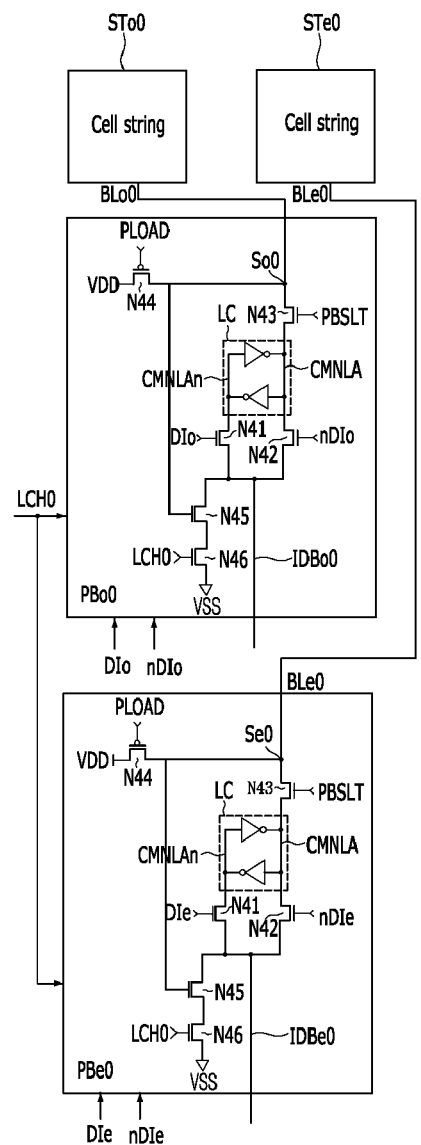
FIG. 10 is a representation of an example of a circuit diagram to assist in the explanation of page buffers illustrated in FIG. 9.

FIG. 10 is a representation of an example of a circuit diagram to assist in the explanation of page buffers illustrated in FIG. 9.

In particular, FIG. 10 illustrates the circuit configurations of the first odd and even page buffers PBo0 and PBe0. The circuit configurations of the remaining page buffers PBo<7:1> and PBe<7:1> are realized similarly to the circuit configurations of the first odd and even page buffers PBo0 and PBe0 illustrated in FIG. 10.

Referring to FIG. 10, the first odd page buffer PBo0 may include a latch circuit LC which has a latch node CMNLA and an inverted latch node CMNLAn. Transistors N41 and N42 of the first odd page buffer PBo0 are respectively controlled by odd data input select signals DIo and nDIo. The transistors N41 and N42 are electrically coupled between the first odd internal data line IDBo0 and the inverted latch node CMNLAn and between the first odd internal data line IDBo0 and the latch node CMNLA, respectively. Another transistor N43 is controlled by a page buffer select signal PBSLT, and is electrically coupled between the latch node CMNLA and a sense node So0. The sense node So0 electrically coupled to a first odd cell string STo0 is selectively electrically coupled to a power supply voltage VDD by the operation of another transistor N44 which is controlled by a load control signal PLOAD. Finally, 2 transistors N45 and N46 are electrically coupled in series between the first odd internal data line IDBo0 and a reference voltage VSS. One of the 2 transistors N45 and N46 is controlled by a voltage appearing on the sense node So0, and the other of the 2 transistors N45 and N46 is controlled by the latch signal LCH0.

In a program operation, the latch circuit LC of the first odd page buffer PBo0 stores a logic value that is indicated by the odd data input select signals DIo and nDIo and the voltage of the first odd internal data line IDBo0. Then, the logic value, that is, a voltage appearing on the latch node CMNLA is transmitted to the first odd bit line BLo0 of the memory cell string for programming. In a manner similar to this, in a read operation, a sensed voltage appearing on the sense node So0 is temporarily stored in the latch circuit LC, and is then outputted to an exterior through the first odd internal data line IDBo0.

Unlike the first odd page buffer PBo0 which is electrically coupled between the first odd bit line BLo0 of the first odd cell string STo0 and the first odd internal data line IDBo0 and in which the transistors N41 and N42 therein are controlled by the odd data input select signals DIo and nDIo, the first even page buffer PBe0 is electrically coupled between the first even bit line BLe0 of the first even cell string STe0 and the first even internal data line IDBe0 and the transistors N41 and N42 therein are controlled by the even data input select signals DIe and nDIe. Since the other configuration of the first even page buffer PBe0 is substantially the same as the configuration of the first odd page buffer PBo0, repeated descriptions for the same configuration will be omitted herein.

FIG. 11 is a diagram illustrating a representation of an example of the layout structure of the page buffers included in a page buffer block illustrated in FIG. 7. In particular, FIG. 11 shows the first page buffer block PBB0.

Referring to FIG. 11, the first page buffer block PBB0 may include N (N is 2 or 3) number of sub page buffer blocks SPBB<2:0> which are arranged in a bit line direction BLD. The present embodiment illustrates the example where the number of the sub page buffer blocks SPBB included in the first page buffer block PBB0 is 3. However, the embodiments are not limited in this manner and any number of sub page buffer blocks may be implemented.

Each of the sub page buffer blocks SPBB<2:0> may include 16 page buffers PBo and PBe which are arranged in a 4 (word line direction)×4 (bit line direction) array. That is to say, the first sub page buffer block SPBB0 may include first to eighth odd page buffers PBo<7:0> and first to eighth even page buffers PBe<7:0> which are arranged in a 4 (word line direction)×4 (bit line direction) array, the second sub page buffer block SPBB1 may include ninth to sixteenth odd page buffers PBo<15:8> and ninth to sixteenth even page buffers PBe<15:8> which are arranged in a 4 (word line direction)×4 (bit line direction) array, and the third sub page buffer block SPBB2 may include seventeenth to twenty-fourth odd page buffers PBo<23:16> and seventeenth to twenty-fourth even page buffers PBe<23:16> which are arranged in a 4 (word line direction)×4 (bit line direction) array. For example, the sixteen page buffers (i.e., PBe<7:0>, PBo<7:0>, PBe<15:8>, PBo<15:8>, PBe<23:16>, or PBo<23:16>) may be arranged to create 4 columns of 4 rows (i.e., 4 columns, each column having 4 rows, and each row of a column including one page buffer) as illustrated in FIG. 11. However, the embodiments are not limited in this manner and the page buffers PB of the sub page buffer blocks SPBBr may be arranged differently with more or less page buffers PB.

Since the 3 sub page buffer blocks SPBB<2:0> are arranged in the bit line direction BLD and page buffers in each of the sub page buffer blocks SPBB<2:0> are arranged in 4 rows in the bit line direction BLD, the page buffers of the first page buffer block PBB0 are arranged in 12 rows in the bit line direction BLD. Thus, the length of the first page buffer block PBB0 in the bit line direction BLD will be [the length of each page buffer in the bit line direction]×12.

As described above with reference to FIG. 7, since the page buffer blocks PBB<r:0> are arranged in a word line direction WLD, the length of the page buffer unit 120 in the bit line direction BLD will be the same as the length of the first page buffer block PBB0 in the bit line direction BLD. In other words, the length of the page buffer unit 120 will be [the length of each page buffer in the bit line direction]× (times or multiplied by) 12.

Since each of the number of even bit lines and the number of odd bit lines is K+1, the length of the page buffer unit 120 in the word line direction WLD will be [the pitch of each bit line]×(K+1)×(times or multiplied by) 2.

It may be assumed that, unlike the present embodiment, 16 page buffers included in each sub page buffer block are arranged in the bit line direction BLD in the viewpoint of transmission of data. In this example, since 16 page buffers are arranged in the bit line direction BLD, the length of the page buffer unit 120 in the bit line direction BLD cannot help but be increased when compared to the present embodiment in which 12 page buffers are arranged in the bit line direction BLD.

Since each of the number of odd bit lines and the number of even bit lines is constant as K+1, the length of the page buffer unit 120 in the word line direction WLD will be [the pitch of each bit line]×(K+1)×2 to be the same as in the present embodiment.

Namely, according to an embodiment, the length of the page buffer unit 120 in the bit line direction BLD may be decreased while constantly retaining the length of the page buffer unit 120 in the word line direction WLD, and as a result, the occupation area of the page buffer unit 120 may be reduced.

Figure 12:
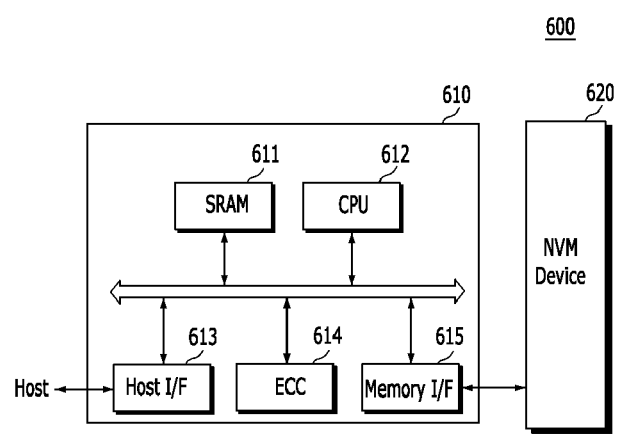
FIG. 12 is a block diagram schematically illustrating a representation of an example of a memory system including a semiconductor memory device in accordance with an embodiment.

FIG. 12 is a block diagram schematically illustrating a representation of an example of a memory system including a semiconductor memory device in accordance with an embodiment.

Referring to FIG. 12, a memory system 600 in accordance with an embodiment may include a nonvolatile memory device 620 and a memory controller 610.

The nonvolatile memory device 620 may be configured as the semiconductor memory devices described above and may operate in the manners described above. The memory controller 610 is configured to control the nonvolatile memory device 620. By the combination of the nonvolatile memory device 620 and the memory controller 610, a memory card or a solid state disk (SSD) may be provided. An SRAM 611 is used as the working memory of a central processing unit (CPU) 612. A host interface 613 is equipped with the data exchange protocol of a host which is electrically coupled to the memory system 600.

An error correction code block 614 detects and corrects an error included in the data read out from the nonvolatile memory device 620.

A memory interface 615 interfaces with the nonvolatile memory device 620. The CPU 612 performs general control operations for data exchange of the memory controller 610.

Although not illustrated in the drawing, it is obvious to a person skilled in the art to which the embodiments pertain that the memory system 600 in accordance with the embodiments may be additionally provided with a ROM which stores code data for interfacing with the host. The nonvolatile memory device 620 may be provided as a multi-chip package which is constructed by a plurality of flash memory chips.

The memory system 600 in accordance with the embodiments, described above, may be provided as a storage medium of high reliability, which has a low probability of an error to occur. In particular, the aforementioned semiconductor memory devices may be provided for a memory system such as a solid state disk (SSD) which is being actively studied recently. In this example, the memory controller 610 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 13:
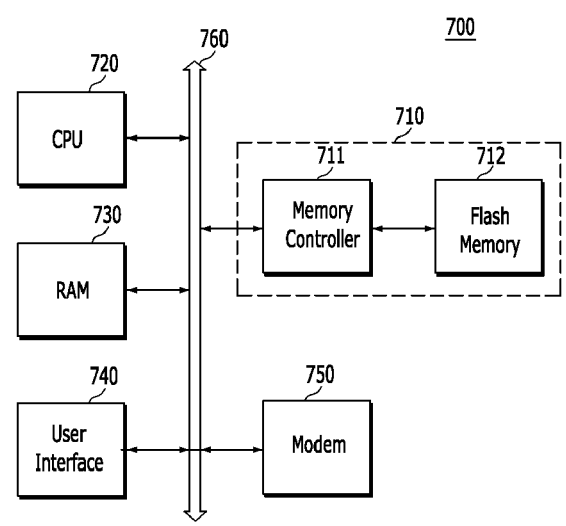
FIG. 13 is a block diagram schematically illustrating a representation of an example of a computing system including a semiconductor memory device in accordance with an embodiment.

FIG. 13 is a block diagram schematically illustrating a representation of an example of a computing system including a semiconductor memory device in accordance with an embodiment.

A computing system 700 in accordance with an embodiment may include a microprocessor 720, a RAM 730, a user interface 740, a modem 750 such as a baseband chipset, and a memory system 710, which are electrically coupled to a system bus 760. In the example where the computing system 700 in accordance with the embodiment is a mobile device, a battery (not illustrated) for supplying the operating voltage of the computing system 700 may be additionally provided. Although not illustrated in the drawing, it is obvious to a person skilled in the art to which the embodiments pertain that the computing system 700 in accordance with the embodiments may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, a OneNAND flash memory).

It is not that the above-described embodiments are realized only by a device and a method, and they may be realized also by a program which performs a function corresponding to the configuration of each embodiment or a recording medium on which the program is recorded. Such realization may be easily derived from the descriptions of the above-described embodiments by a person skilled in the art to which the embodiments pertain.

While various embodiments have been described above, it will be understood to those skilled in the art that the embodiments described are by way of example only. Accordingly, the semiconductor memory devices described herein should not be limited based on the described embodiments.

What is claimed is:

1. A semiconductor memory device comprising:
a memory cell array having a plurality of memory cells, a plurality of word lines and a plurality of bit lines;
a page buffer block including N number of sub page buffer blocks, the sub page buffer blocks arranged in a bit line direction and each of the sub page buffer blocks include a plurality of page buffers arranged in a word line direction and a bit line direction;
common internal data lines respectively corresponding to the sub page buffer blocks; and
a page buffer decoder including page buffer selection units, the page buffer selection units electrically coupled between the page buffers, respectively, included in each sub page buffer block, and a common internal data line corresponding to the sub page buffer block, and the page buffer selection units configured to selectively electrically couple the page buffers, respectively, included in the sub page buffer block, to the common internal data line in response to bit line address signals.

2. The semiconductor memory device according to claim 1, wherein the page buffers included in the plurality of sub page buffer blocks, respectively, are arranged in 4 columns, each column having 2 rows, and each row of a column including one page buffer.

3. The semiconductor memory device according to claim 1,
wherein the page buffer selection units are electrically coupled to the page buffers through internal data lines, respectively, and
wherein the common internal data line corresponding to the sub page buffer block is electrically coupled in common to the internal data lines through the page buffer selection units and is configured to serve as a shared input/output line.

4. The semiconductor memory device according to claim 1, further comprising:
page buffer decoder blocks including a plurality of page buffer decoders respectively corresponding to the sub page buffer blocks included in a corresponding page buffer block,
wherein a number of the page buffer decoders included in each of the page buffer decoder blocks is the same as a number of the sub page buffer blocks included in a corresponding page buffer block.

5. The semiconductor memory device according to claim 1, wherein each of the bit lines comprises an even bit line and an odd bit line.

6. The semiconductor memory device according to claim 5, further comprising:
a bit line control block configured to select any one of the odd bit line and the even bit line.

7. The semiconductor memory device according to claim 1,
wherein the bit line address signals include a first and a second bit line address signals;
wherein each of the page buffer selection units comprises:
a first transistor having one end electrically coupled to an internal data line of a corresponding page buffer, and controlled by the first bit line address signal; and
a second transistor electrically coupled between the other end of the first transistor and a corresponding common internal data line, and controlled by the second bit line address signal, and
wherein the first and second bit line address signals provided to the page buffer selection units have different combinations.

8. The semiconductor memory device according to claim 7,
wherein the first bit line address signal comprises an odd bit line address signal and an even bit line address signal, and
wherein first transistors of page buffer selection units corresponding to page buffers disposed in a first row are configured to be controlled by the odd bit line address signal, and
wherein first transistors of page buffer selection units corresponding to page buffers disposed in a second row are configured to be controlled by the even bit line address signal.

9. The semiconductor memory device according to claim 7,
wherein the second bit line address signal comprises first to fourth bit signals; and
wherein the first to fourth bit signals are configured to control one of second transistors of the page buffer selection units corresponding to the page buffers disposed in the first row and one of second transistors of the page buffer selection units corresponding to the page buffers disposed in the second row.

10. The semiconductor memory device according to claim 1, further comprising:
a global data bus,
wherein the page buffer decoder further includes a third transistor electrically coupled between the common internal data line and the global data bus and which electrically couples the common internal data line to the global data bus in response to a global bit line address signal.

11. The semiconductor memory device according to claim 1, wherein the semiconductor memory device comprises a page buffer unit including a plurality of page buffer blocks arranged in a word line direction.

12. A semiconductor memory device comprising:
a memory cell array having a plurality of memory cells, a plurality of word lines and a plurality of odd and even bit lines;
a page buffer block including N number of sub page buffer blocks, the sub page buffer blocks arranged in a bit line direction and each of the sub page buffer blocks includes a plurality of even and odd page buffers arranged in a word line direction and a bit line direction;
common internal data lines respectively corresponding to the sub page buffer blocks; and
a page buffer decoder including page buffer selection units, the page buffer selection units electrically coupled between the even and odd page buffers, respectively, included in each sub page buffer block, and a common internal data line corresponding to the sub page buffer block, and the page buffer selection units configured to selectively electrically couple the even and odd page buffers, respectively, included in the sub page buffer block, to the common internal data line in response to bit line address signals.

13. The semiconductor memory device according to claim 12, wherein the even and odd page buffers included in the plurality of sub page buffer blocks, respectively, are arranged in 4 columns, each column having 4 rows, and each row of a column including one page buffer.

14. The semiconductor memory device according to claim 12,
wherein the page buffer selection units are electrically coupled to the even and odd page buffers through internal data lines, respectively, and
wherein the common internal data line corresponding to the sub page buffer block is electrically coupled in common to the internal data lines through the page buffer selection units and is configured to serve as a shared input/output line.

15. The semiconductor memory device according to claim 12, further comprising:
page buffer decoder blocks including a plurality of page buffer decoders respectively corresponding to the sub page buffer blocks included in a corresponding page buffer block,
wherein a number of the page buffer decoders included in each of the page buffer decoder blocks is the same as a number of the sub page buffer blocks included in a corresponding page buffer block.

16. The semiconductor memory device according to claim 12,
wherein the bit line address signals include a first and a second bit line address signals;
wherein each of the page buffer selection units comprises:
a first transistor having one end electrically coupled to an internal data line of a corresponding page buffer, and controlled by the first bit line address signal; and
a second transistor electrically coupled between the other end of the first transistor and a corresponding common internal data line, and controlled by the second bit line address signal, and
wherein the first and second bit line address signals provided to the page buffer selection units have different combinations.

17. The semiconductor memory device according to claim 16,
wherein the first bit line address signal comprises an odd bit line address signal and an even bit line address signal,
wherein first transistors of page buffer selection units corresponding to page buffers disposed in an odd-numbered row are configured to be controlled by the odd bit line address signal, and
wherein first transistors of page buffer selection units corresponding to page buffers disposed in an even-numbered row are configured to be controlled by the even bit line address signal.

18. The semiconductor memory device according to claim 16,
wherein the second bit line address signal comprises first to eighth bit signals;
wherein the first to fourth bit signals are configured to control one of second transistors of page buffer selection units corresponding to page buffers disposed in a first row and one of second transistors of page buffer selection units corresponding to page buffers disposed in a second row, and
wherein the fifth to eighth bit signals are configured to control one of second transistors of page buffer selection units corresponding to page buffers disposed in a third row and one of second transistors of page buffer selection units corresponding to page buffers disposed in a fourth row.

19. The semiconductor memory device according to claim 12, further comprising:
a global data bus,
wherein the page buffer decoder further includes a third transistor electrically coupled between the common internal data line and the global data bus and which electrically couples the common internal data line to the global data bus in response to a global bit line address signal.

20. The semiconductor memory device according to claim 12, wherein the semiconductor memory device comprises a page buffer unit including a plurality of page buffer blocks arranged in a word line direction.

* * * * *